(12) United States Patent
Tai

(10) Patent No.: US 6,686,277 B1
(45) Date of Patent: Feb. 3, 2004

(54) METHOD OF MANUFACTURING SEMICONDUCTOR DEVICE

(75) Inventor: Kaori Tai, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/706,791

(22) Filed: Nov. 7, 2000

(30) Foreign Application Priority Data

Sep. 11, 2000 (JP) ........................................ 2000/275207

(51) Int. Cl.[7] ...................... H01L 21/44; H01L 21/3205; H01L 21/4763; H01L 21/31
(52) U.S. Cl. ...................... 438/664; 438/585; 438/591; 438/595; 438/648; 438/775
(58) Field of Search ................................. 438/585, 591, 438/592, 593, 595, 648, 775, 664

(56) References Cited

U.S. PATENT DOCUMENTS

| | | | | |
|---|---|---|---|---|
| 5,300,455 A | * | 4/1994 | Vuillermoz et al. | 438/653 |
| 5,397,909 A | * | 3/1995 | Moslehi | 257/383 |
| 5,612,249 A | * | 3/1997 | Sun et al. | 438/297 |
| 6,114,736 A | * | 9/2000 | Balasubramanyam et al. | 257/412 |
| 6,133,150 A | * | 10/2000 | Nakajima et al. | 438/694 |
| 6,144,071 A | * | 11/2000 | Gardner et al. | 257/344 |
| 6,162,717 A | * | 12/2000 | Yeh | 438/595 |
| 6,180,501 B1 | * | 1/2001 | Pey et al. | 438/592 |
| 6,200,870 B1 | * | 3/2001 | Yeh et al. | 438/302 |
| 6,255,698 B1 | * | 7/2001 | Gardner et al. | 257/369 |
| 6,265,297 B1 | * | 7/2001 | Powell | 438/592 |
| 6,277,719 B1 | * | 8/2001 | Chern et al. | 438/585 |
| 6,284,634 B1 | * | 9/2001 | Rha | 438/592 |
| 6,323,519 B1 | * | 11/2001 | Gardner et al. | 257/336 |

OTHER PUBLICATIONS

Yasushi Akasaka et al., "Low–Resistivity Poly–Metal Gate Electrode Durable for High–Temperature Processing,"; IEEE Transactions on Electrons Devices, vol. 43, No. 11, Nov. 1996, pp. 1864–1869.

* cited by examiner

Primary Examiner—Matthew Smith
Assistant Examiner—Chuong Luu
(74) Attorney, Agent, or Firm—Volentine Francos, PLLC

(57) ABSTRACT

A refractory metal film is formed over a semiconductor substrate, and a first nitride film is formed over the refractory metal film. Thereafter, the refractory metal film and the nitride film are patterned and the sides of the patterned refractory metal film are nitrided.

12 Claims, 2 Drawing Sheets

METHOD OF MANUFACTURING SEMICONDUCTOR DEVICE

BACKGROUND OF THE INVENTION

1. Field of the Invention

The present invention relates to a method of manufacturing a gate electrode which utilizes a refractory metal, or a wire which employs a refractory metal.

2. Description of the Related Art

A polycrystalline silicon gate electrode or a polycide gate electrode structure in which a tungsten silicide film is stacked on a polycrystalline silicon film, has heretofore generally been used as a structure of a gate electrode for a device. With a view toward implementing high integration and speeding-up of the device, the gate electrode stands in need of a further reduction in resistance, and the development of a technique for implementing it has been pursued.

As an example, a gate structure (Reference: Y. Akasaka et al., IEEE Trans. Electron Devices, ED-43, 1864 (1996)) called "polymetal gate" has been reported in which a refractory metal such as tungsten, a barrier layer comprised of its nitride, and a polycrystalline silicon film are stacked on one another. This is considered to be a structure effective in implementing a low-resistance gate.

With high integration of the device, allowance for alignment of each contact hole to the source and drain with its corresponding gate electrode approaches the limit of the lithography technology. There has been an increasingly demand for application of a Self Aligned Contact (hereinafter called "SAC") technology in order to overcome such a limit.

The SAC technology is used with the objective of, when a portion above each gate electrode and side walls thereof are formed of silicon nitride films and contact holes reaching source and drain diffused layers are defined in an interlayer dielectric, the gate electrode is masked by these silicon nitride films, whereby the contact holes for the source and drain are formed on a self-alignment basis.

SUMMARY OF THE INVENTION

Forming a nitride film over a patterned polymetal gate and subjecting it to anisotropic etching forms side walls of a silicon nitride film. The nitride film is normally formed by a reduced pressure CVD method. The growth of the silicon nitride film by the reduced pressure CVD method is normally performed at a high temperature of 700° C. or higher.

When the tungsten is used for a polymetal gate electrode, a tungsten oxide film is formed over exposed sides of the tungsten. When a wafer is subjected to a high temperature in a state in which such a tungsten oxide film has been formed, whisker is produced.

A reduction in the oxidization of the tungsten film upon deposition of the nitride film is important to inhibit the occurrence of the whisker. Therefore, there has been proposed a method of reducing a wafer insertion temperature from 550° C. to 350° C. or performing a reducing process using ammonia to remove oxygen in the tungsten oxide film formed over the tungsten film, for example. However, when the wafer insertion temperature is lowered, an increase in processing time takes place as a problem. Since the execution of the ammonia reducing process depends on processing pressure, it is difficult to set the optimum processing condition.

An object of the present invention is to provide a method of inhibiting the occurrence of whisker more reliably.

According to one aspect of the present invention, for achieving this object, a refractory metal film is formed over a semiconductor substrate and a first nitride film is formed over the refractory metal film. Thereafter, the refractory metal film and the nitride film are patterned and the sides of the patterned refractory metal film are nitrided.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFFERED EMBODIMENTS

Figure 1A:
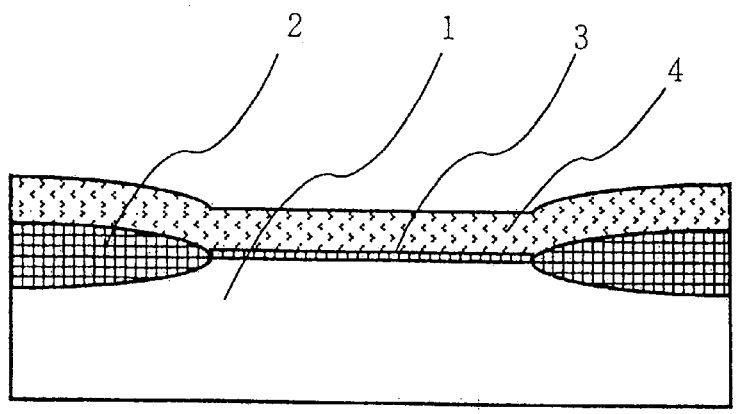
FIG. 1 is a cross-sectional view for describing a manufacturing process according to a first embodiment of the present invention.

A first embodiment of the present invention will be described below with reference to FIGS. 1 and 2. As shown in FIG. 1(a), a gate oxide film 3 having a thickness of from 1 nm to 10 nm, and a polycrystalline silicon film 4 having a thickness of from 50 nm to 200 nm are successively formed over a semiconductor substrate 1 on which an element separation region 2 comprised of, for example, a thick silicon oxide film is formed. The gate oxide film 3 is formed under the condition that, for example, a deposition or growth temperature is 800° C. and $H_2:O_2:N_2=1:1:4$. The polycrystalline silicon film 4 is formed by using, for example, a vertical LPCVD (Low Pressure Chemical Vapor Deposition) device on the condition that a growth temperature is 620° C., the pressure is 0.2 Torr and $SiH_4$ is supplied at a flow rate of 250 sccm as a reaction gas.

Next, an ion is introduced into the polycrystalline silicon film 4. For example, a phosphorous ion is used as the ion and introduced under conditions of 15 keV and 5E15 $cm^{-2}$. After the phosphorous ion has been introduced into the polycrystalline silicon film 4, it is subjected to activated heat treatment at 1000° C. for 10 seconds, for example.

Arsenic, boron and the like may be used as the ion in addition to the phosphorous ion. The arsenic is introduced under conditions of 40 keV and 5E15 $cm^{-2}$, and the boron is introduced under conditions of 10 keV and 2E15 $cm^{-2}$, respectively. Conditions for the activated heat treatment are similar to the case for the phosphorous ion.

As to a method of forming the polycrystalline silicon film 4, a method of adding $PH_3$ or the like upon formation of the polycrystalline silicon film may be used to form a polycrystalline silicon film 4 doped with an impurity.

Figure 1B:
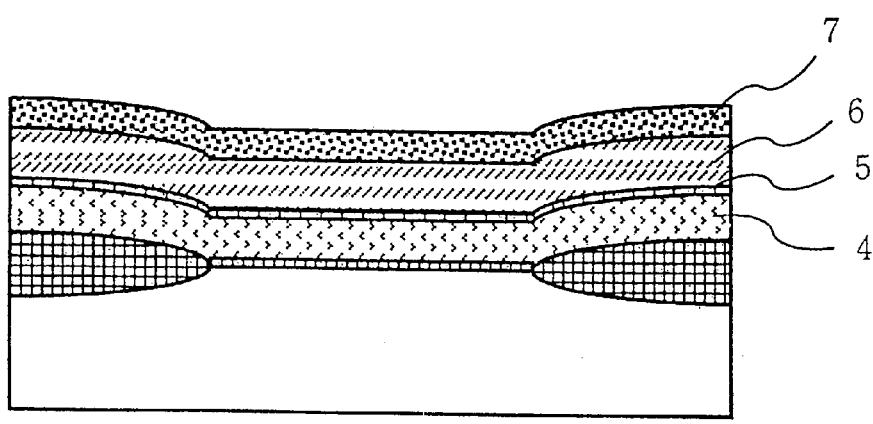

Next, as shown in FIG. 1(b), a tungsten nitride film 5 is grown or deposited over the polycrystalline film 4 with a thickness of from 3 nm to 10 nm.

The tungsten nitride film 5 is grown at room temperature under a pressure of 3 mTorr through the use of a gas of $Ar:N_2=1:1$ with a sputter power of 0.5 kW by a sputtering method. Tungsten is used as a target.

Next, a tungsten film 6 is grown over the tungsten nitride film 5 with a thickness of from 30 nm to 200 nm. The tungsten film 6 is deposited at room temperature under a pressure of 3 mTorr through the use of an Ar gas with a sputter power of 1 kW by the sputtering method. Tungsten is used as a target.

A silicon nitride film 7 is next grown over the tungsten film 6 with a thickness of 100 nm to 300 nm.

The silicon nitride film 7 is formed at a temperature of 400° C. to 500° C. by a plasma CVD method.

The silicon nitride film 7 is formed on the condition that a growth temperature is 420° C., $SiH_4/N_2/NH_3$=240/600/1350 sccm, the pressure is 3.5 Torr, and plasma power is 500/170W.

The tungsten nitride film 5 is used to inhibit the reaction of the tungsten film 6 with the polycrystalline silicon film 4. Therefore, for example, a titanium nitride film or the like may be used if capable of inhibiting the reaction of the tungsten film 6 with the polycrystalline silicon film 4.

When the tungsten nitride film is used, it can be grown within the same processing unit as for the tungsten film 6 and a wafer transfer time can be saved.

When the tungsten is formed over the tungsten nitride, the tungsten is apt to increase in grain size and low resistivity is obtained.

While the tungsten film 6 is used in the present embodiment, a refractory metal having relatively low resistance may be used in place of the tungsten film.

Figure 1C:
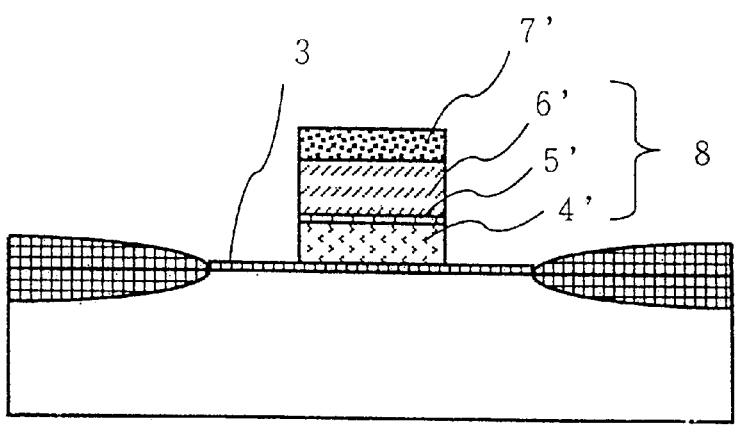

The polycrystalline silicon film 4, the tungsten nitride film 5, and the tungsten film 6 are next pattered as shown in FIG. 1(*c*) to thereby form a laminated electrode 8 comprised of a polycrystalline silicon film 4', a tungsten nitride film 5' and a tungsten film 6'.

According to this patterning, an unillustrated resist pattern is formed over the tungsten film 6 shown in FIG. 1(*b*). Thereafter, the silicon nitride film 7 is removed by anisotropic etching with the resist pattern as a mask, and the tungsten film 6, the tungsten nitride film 5 and the polycrystalline silicon film 4 are removed by anisotropic etching with the patterned silicon nitride film as a mask.

For example, a gas of $He/CH_2F_2/CF_4$, a pressure of 7 mTorr and a RF power of 450/50W are used as a condition for etching the silicon nitride film 7.

As a condition for etching the tungsten film 6 and the tungsten nitride film 5, for example, a gas of $CF_4/O_2/Cl_2$, a pressure of 5 mTorr and a RF power of 200/75W are used.

As a condition for etching the polycrystalline silicon film 4, for example, a gas of $HBr/Cl_2/O_2$, a pressure of 5 mTorr, a RF power of 250/50W, a gas of $HBr/O_2/H_2$, a pressure of 60 mTorr, and a RF power of 250/50W are used.

Figure 2A:
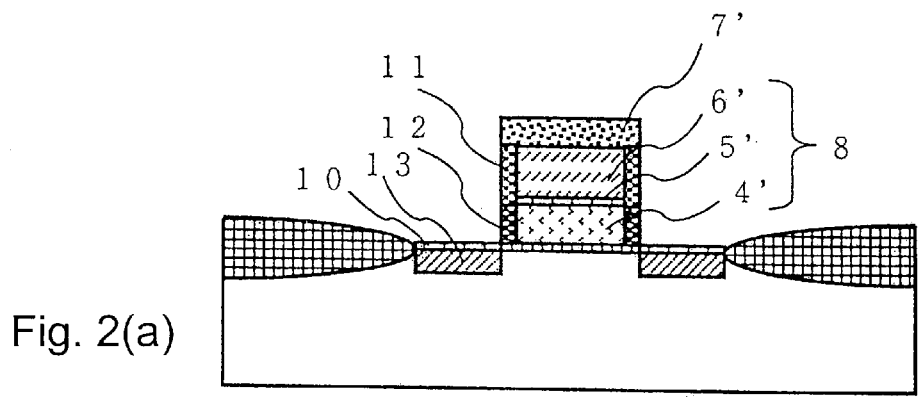
FIG. 2 is a cross-sectional view for describing a manufacturing process according to the first embodiment of the present invention.
Figure 2B:
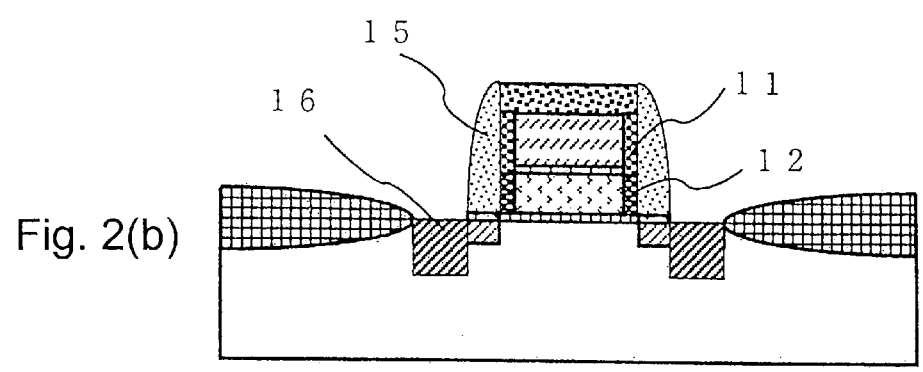

Next, the surface of the tungsten film 6' is nitrided as shown in FIG. 2(*a*). A condition for nitriding the tungsten film 6' is performed under a plasma power of 100W to 1000W, an $NH_3$ gas flow rate of 100 sccm to 1000 sccm, an Ar gas flow rate of 500 sccm to 2000 sccm, and a pressure of 0.1 Torr to 10 Torr. In the present invention, the gas is not necessarily limited to $NH_3$ if it is capable of nitriding at a low temperature. For example, an $N_2$ gas may be used.

According to such a nitriding process, a tungsten nitride film 11 having a thickness of 1 nm to 10 nm is formed over the surface of the tungsten film 6'.

According to the nitriding process, the sides of the polycrystalline silicon film 4' and part of the gate oxide film 3 are also nitrided into a silicon nitride film (SiNx) 12 and a silicon oxynitride film (SiONx) 10 respectively.

Afterwards, a phosphorous ion is implanted in the surface of the substrate by 4E12 $cm^{-2}$ at 15 keV to form N-type shallow junctions 13.

Further, implanting a $BF_2$ ion therein by 2E15 $cm^{-2}$ at 5 keV can form a P-type shallow junction.

Each of the shallow junctions 13 is used as an LDD layer for a transistor.

Next, side walls 15 are formed over the corresponding side walls of the laminated electrode 8 as shown in FIG. 2(*b*). A silicon nitride film is formed over the surface of the substrate and the entire surface thereof is subjected to anisotropic etching to thereby form the side walls 15.

According to an LPCVD method, the silicon nitride film is formed with a thickness of from 300 Å to 2000 Å under the condition that the growth temperature is 780° C., the pressure is 0.35 Torr, and the gas is $NH_3/SiH_2Cl_2$=1000/100 sccm.

The LPCVD method satisfactory in coverage may preferably be used upon formation of the side walls 15. While the silicon nitride film is normally processed at a high temperature in a process for forming the silicon nitride film by the LPCVD method, the side walls of the tungsten are nitrided in the invention of the present application. Therefore, whisker can be inhibited from taking place from the side walls of the tungsten.

After the formation of the side walls 15, an arsenic ion is implanted in the substrate by 4E15 $cm^{-2}$ at 50 keV with the side walls 15 as masks to thereby form deep junctions 16.

When it is desired to form a P-type deep junction, it can be formed by implanting a $BF_2$ ion in the substrate over 2E15 $cm^{-2}$ at 20 keV.

The deep junctions 16 are diffused layers used as the source and drain of the transistor.

In the first embodiment, the sides of the tungsten film 6' are nitrided before the formation of the side walls 15 on the sides of the tungsten film 6' to form the tungsten nitride film. Therefore, the sides of the tungsten film 6' can be inhibited from oxidization upon formation of the side walls 15, and the whisker can be restrained from occurring.

Incidentally, while the laminated electrode 8 is configured as the laminated structure made up of the three layers comprised of the polycrystalline silicon film 4', the tungsten nitride film 5' and the tungsten film 6' in the first embodiment, the present invention is not limited to this type of laminated structure. The laminated structure may be provided as a bilayered structure comprising a tungsten nitride film and tungsten film, for example.

Further, the present embodiment is not necessarily limited to the gate electrode and may be applied even to a wire. When the present embodiment is applied to the wire, the above-described polycrystalline silicon film 4', tungsten nitride film 5' and tungsten film 6' are formed over an unillustrated insulating film without the formation of the gate insulator 3 in the first embodiment. The wire may be configured as a bilayered structure in which the tungsten nitride film 5' and the tungsten film 6' are formed over the unillustrated insulating film without having to form the polycrystalline silicon film 4'.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:

forming a film comprised of a refractory metal over a semiconductor substrate;

forming a first nitride film over the refractory metal film;

patterning the refractory metal film and the first nitride film;

nitriding the sides of the patterned refractory metal film; and forming nitride side walls on the nitrided sides of the patterned refractory metal film and on the patterned first nitride film, said forming nitride side walls comprises a reduced pressure CVD process carried out at 780° C.

2. The method according to claim 1, wherein the refractory metal film is formed over a polycrystalline silicon film formed over the semiconductor substrate, through a barrier film for inhibiting reaction with the polycrystalline silicon film.

3. A method of manufacturing a semiconductor device, comprising:

forming a film comprised of a refractory metal over a semiconductor substrate;

forming a first nitride film over the refractory metal film;

patterning the refractory metal film and the first nitride film;

nitriding the sides of the patterned refractory metal film; and forming nitride side walls on the nitrided sides of the patterned refractory metal film and on the patterned first nitride film, said nitriding the sides of the patterned refractory metal film is executed according to a plasma nitriding process using ammonia.

4. The method according to claim 1, wherein the refractory metal is tungsten.

5. A method of manufacturing a semiconductor device, comprising:

forming a gate insulator over a semiconductor substrate;

forming a refractory metal film over the gate insulator;

forming a nitride film over the refractory metal film;

patterning the nitride film and the refractory metal film;

nitriding sides of the refractory metal film which have been patterned and exposed; and forming nitride side walls over the nitrided sides of the patterned refractory metal film and on the patterned nitride film, said forming nitride side walls comprises a low-pressure CVD process carried out at a temperature of 780° C.

6. The method according to claim 1, wherein the low-pressure CVD process is carried out at a pressure of 0.35 Torr.

7. The method according to claim 1, wherein the low-pressure CVD process is carried out using $NH_3/SiH_2Cl_2$ gas.

8. The method according to claim 7, wherein the $NH_3/SiH_2Cl_2$ gas composition is 1000/100 sccm.

9. The method according to claim 5, wherein the low-pressure CVD process is carried out at a pressure of 0.35 Torr.

10. The method according to claim 5, wherein the low-pressure CVD process is carried out using $NH_3/SiH_2Cl_2$ gas.

11. The method according to claim 10, wherein the $NH_3/SiH_2Cl_2$ gas composition is 1000/100 sccm.

12. The method according to claim 5, wherein the refractory metal is tungsten.

* * * * *